(12) United States Patent
Janai et al.

(10) Patent No.: US 6,255,718 B1
(45) Date of Patent: Jul. 3, 2001

(54) LASER ABLATEABLE MATERIAL

(75) Inventors: Meir Janai; Yoram Cassuto; Michael Stephen Silverstein, all of Haifa (IL); Sharon Zehavi, Sunnyvale, CA (US)

(73) Assignee: Chip Express Corporation, Santa Clara, CA (US)

( * ) Notice: Subject to any disclaimer, the term of this patent is extended or adjusted under 35 U.S.C. 154(b) by 0 days.

(21) Appl. No.: 08/894,540

(22) PCT Filed: Feb. 27, 1996

(86) PCT No.: PCT/US96/02920

§ 371 Date: Jan. 30, 1998

§ 102(e) Date: Jan. 30, 1998

(87) PCT Pub. No.: WO96/27212

PCT Pub. Date: Sep. 6, 1996

(30) Foreign Application Priority Data

Feb. 28, 1995 (IL) .................................................... 112826

(51) Int. Cl.$^7$ ............................ H01L 23/58; B32B 9/04; H05H 1/26; C08J 7/18
(52) U.S. Cl. ..................... 257/642; 428/411.1; 264/483; 427/490
(58) Field of Search ..................... 257/642, 643, 257/579, 529; 427/554, 555, 556, 553, 39; 428/408, 411.1; 204/181.1; 148/187; 430/322; 219/121 L; 264/25, 483

(56) References Cited

U.S. PATENT DOCUMENTS

| | | | |
|---|---|---|---|
| 4,177,474 | 12/1979 | Ovshinsky | 357/2 |
| 4,226,898 | 10/1980 | Ovshinsky et al. | 427/39 |
| 4,371,407 | 2/1983 | Kurosawa | 148/187 |
| 4,374,179 * | 2/1983 | Lin et al. | 428/411 |
| 4,517,223 | 5/1985 | Ovshinsky et al. | 427/39 |
| 4,727,234 | 2/1988 | Oprysko et al. | 219/121 L |
| 4,924,287 | 5/1990 | Orbach | 357/51 |
| 5,126,164 | 6/1992 | Okazaki et al. | 427/39 |
| 5,182,000 | 1/1993 | Antonelli et al. | 204/181.1 |
| 5,196,376 | 3/1993 | Reche | 437/225 |
| 5,302,420 * | 4/1994 | Nguyen et al. | 427/490 |
| 5,302,547 | 4/1994 | Wojnarowski et al. | 437/173 |
| 5,310,624 | 5/1994 | Ehrlich | 430/322 |
| 5,312,529 | 5/1994 | Antonelli et al. | 204/181.1 |
| 5,329,152 | 7/1994 | Janai et al. | 257/529 |
| 5,380,474 * | 1/1995 | Rye et al. | 264/25 |
| 5,470,661 | 11/1995 | Bailey et al. | 428/408 |
| 5,554,570 | 9/1996 | Maeda et al. | 437/235 |

FOREIGN PATENT DOCUMENTS

| | | |
|---|---|---|
| WO 89/07285 | 8/1989 | (WO) . |
| WO 95/06900 | 3/1995 | (WO) . |

OTHER PUBLICATIONS

Patent Abstracts of Japan vol. 007, No. 190, Aug. 19, 1983 & JP 58 093241 A, Jun. 2, 1983.
Morinaka et al., "Heat–Mode Lithography With Dye Deposited Films", Journal of the Electrochemical Society, May 1988, USA, pp. 1275–1278.
Abstract of WO 95/06900.
Meir Janai, "Technologies For Economic Production of Asics", Solid State Technology, Mar. 1993, pp. 35,36,38.
Meir Janai, "Re–Engineering Asic Design Wtih LPGAS", ISBN 0–7803–2707, 1995, New York, IEEE, USA, pp. 60–63.

* cited by examiner

Primary Examiner—Steven Loke
(74) Attorney, Agent, or Firm—Ladas & Parry (57) ABSTRACT

An integrated circuit coated with a layer of plasma deposited polymer which is ablatable by visible light laser radiation. The plasma layer is deposited on the circuit in a plasma chamber and the layer is ablated at selected locations.

7 Claims, 6 Drawing Sheets

LASER ABLATEABLE MATERIAL

This application is the national phase under 35 U.S.C. § 371 of PCT International Application No. PCT/US96/02920, which has an International filing date of Feb. 27, 1996.

FIELD OF THE INVENTION

The present invention relates to materials which are ablateable by lasers of visual light and more particularly to methods of using such materials in the fabrication and customization of integrated circuits.

BACKGROUND OF THE INVENTION

Integrated circuits are usually manufactured in large runs. However it is frequently desirable to make small runs of a specific integrated circuit, typically for prototyping. U.S. Pat. No. 4,924,287, the disclosure of which is incorporated herein by reference, describes a customizable integrated circuit. Methods for customizing of such integrated circuits are shown in U.S. Pat. No. 5,329,152, the disclosure of which is also incorporated herein by reference.

Customizable integrated circuits typically have predetermined portions which are adapted for modification before being supplied to the end user. Such modifications include, inter alia:

(a) electrically programing memory locations;
(b) cutting conducting links; and
(c) creating conducting links.

Customization by cutting of conductor links is preferred since this method does not require extra circuitry on the integrated circuit as do electrically programmable logic devices. Furthermore, pre-produced links can carry a higher current density than created links.

Two methods are mainly used to selectively cut links. One method is to cut each link directly with a laser beam. However, direct cutting with a laser may require high laser energy densities. Application of large amounts of laser energy to integrated circuit surfaces may damage the integrated circuit.

A preferred method of customizing such circuits is to coat them with a layer of laser sensitive ablative material and to ablate the material at selected locations using a relatively small amount of laser radiation. After such ablation, the integrated circuit is etched using an etchant or other etching method that does not remove the ablative material, for example, by chlorine plasma etching. Thus, only areas previously ablated by the laser are etched. Customizable areas typically include metal links so that etching the links modifies the interconnections, and therefore the function, of the integrated circuit.

It is also known to use a photolithographic method wherein the integrated circuit is coated with a layer of radiation sensitive material and exposed to a pattern of ultra violet light, visible light, X-rays or to an electron beam. The coating material is developed and the areas exposed to radiation are removed. The integrated circuit is then etched as described above.

In practice, due to the characteristics required of them, very few materials are useful as laser ablative coatings. An efficient laser ablative material should be capable of absorbing a large portion of the laser energy and in response thereto be transformed directly and immediately to gas. Laser ablation sometimes causes the material to explode. Explosion transforms part of the material to gas, however, some of the material is also blown away as particles. Some of these particles may fall back on the chip and cover-up previously uncovered areas, counteracting the ablation/explosion at these areas. An effective laser ablative material should not form many particles. The term ablation means that the material is turned directly to gas, and very few particles are formed.

It is also desirable that the resultant ablation pattern be as close as possible to the irradiation pattern and that only small amounts of energy leak into the surrounding area and into the integrated circuit. Otherwise, the definition of the geometry will be poor and the integrated circuit may be damaged. Additionally, the material should adhere well to substrates and provide good coverage of step geometries used in microelectronic circuits. Since the purpose of the coating is to protect coated areas while etching the uncoated areas, it is important that the material be resistant to at least one method of etching, preferably a metal etching method.

An example of a material which has some but not all of the previous properties is Arsenic Sulfide. Arsenic Sulfide has most of the abovementioned properties, however, since it does not cover uneven surfaces very well it is not as useful as other materials.

Laser ablative materials which are ablated by ultra violet lasers are known in the art. For example, U.S. Pat. No. 5,302,547 shows covering an integrated circuit with a liquid polymer and ablating that polymer with ultra violet light. However, these polymers are transparent to visible light and are not known to be ablateable by visible light lasers.

Very few materials are known to be ablateable by visible light. Visible light is preferred to ultra violet light because laser technology supplies more efficient and less expensive lasers in visible light wavelengths.

U.S. Pat. No. 5,329,152 discloses the use of amorphous silicon as a visible light laser ablative coating material. Amorphous silicon is ablated by visible light lasers and is partially resistant to etching by chlorine plasma, which is used to etch metals. Thus, an integrated circuit with exposed metal links can be customized by using amorphous silicon as the ablative material.

One problem with amorphous silicon is its high vaporization temperature (2355° C.)—1000° C. over its melting point which increases the tendency to explosion and particle generation.

Plasma deposited polymers (PDP), which are described in "Plasma Polymerization", by H. Yasuda, Academic Press, Inc. 1985, have properties such as crack-filling, chemical inertness and selective permeability which make them useful for a variety of uses such as surgical prosthetics and semi-permeable membranes. U.S. Pat. No. 5,320,875, 5,312,529, 5,283,119 and 5,308,649, the disclosures of which are incorporated herein by reference, disclose methods of manufacturing and uses of PDPs.

PDPs are typically manufactured as follows:

First, a substrate is placed in a plasma chamber. The chamber is then filled with a gas, such as methane, at a low pressure, typically on the order of 1 torr.

Plasma is then created in the chamber, typically using a radio frequency (RF) electric field which ionizes the gas. Consequently, a polymer layer is continually deposited on the substrate.

It should be understood that a PDP is not a direct polymer of the gas used in the process. It is believed that the gas breaks down in the plasma and gas precursors and their compounds form the PDP which is then deposited on the substrate (and on the walls of the chamber). The deposition process is a combination of two processes, one in which molecules hit the substrate and cling, and another in which they do not cling, and may even cause some material to be etched off the substrate. The temperature of the substrate dictates the types of molecules which are likely to cling to the substrate and the manner in which they will be attached to the PDP already deposited.

The gas usually flows through the chamber at a rate which determines the types of molecules that form in the plasma and, consequently, the type of PDP deposited. There are many other parameters which may affect the deposited PDP, such as the distance of the substrate from different portions of the plasma and the RF power used to create the plasma.

The gas used is typically an organic compound. However, some inert gases, such as argon, may be added in order to speed up the deposition process. It has also been observed that similar polymers can be created from different starting materials.

SUMMARY OF THE INVENTION

The inventors have discovered a method of depositing a Plasma Deposited Polymer (PDP) which is laser-ablative by laser light having a wavelength longer than ultra-violet light, such as visible light.

In a preferred embodiment of the invention, the PDP is deposited in the following manner:
  (a) providing a plasma vacuum chamber;
  (b) placing the substrate (typically, a silicon wafer) on the cathode of the chamber;
  (c) introducing a plasma into the chamber, said plasma generated by applying Radio Frequency (RF) radiation to an active gas, the power density used is between 0.08 Watt*cm$^{-2}$ and 1.59 Watt*cm$^{-2}$; and
  (d) terminating the process when the PDP is deposited on the substrate to the desired thickness.

Preferably, an inactive gas such as argon is added to the active gas at a ratio between 3:7 and 7:3, preferably, at a ratio between 4:6 and 6:4; most preferably, at a 1:1 ratio. Preferably the gas mixture is introduced through the anode and turned into a plasma in the chamber. Alternatively, the gas is first turned into a plasma and then introduced into the chamber. The inactive gas may be added before or after the active gas is turned into a plasma.

The substrate is preferably maintained at a temperature below 70° C. A pressure of between 0.1 and 2 torr is maintained, preferably, between 0.5 and 1.5 torr. The inventors have found that a pressure of about 1 torr is most preferred. The active gas used is preferably organic, preferably, a hydro-carbon; typically, ethylene is used. The gas is introduced into the chamber at a flow rate between 1 sccm and 50 sccm, preferably between 10 and 35 sccm and most preferably, about 20 sccm. Preferably, Ionization of the gas is achieved with an RF power density between 0.15 Watt*cm$^{-2}$ and 1 Watt*cm$^{-2}$; most preferably, the power density is between 0.24 Watt*cm$^{-2}$ and 0.48 Watt*cm$^{-2}$. Preferably, the RF radiation is continuous at 13.6 MHz. However, other methods of application of RF enegry may be used, such as pulsed RF radiation at a frequency of 400 MHz. Preferably the cathode is 8" in diameter. The distance between the cathode and the anode is between 1.5 and 10 cm, preferably 3 cm.

A typical deposition time of approximately 10 minutes will produce a polymer of a typically desired thickness of approximately 1$\mu$.

These parameters can be adjusted to create a polymer having predetermined characteristics. Specifically, a material with low specific heat, low heat conductivity, a small difference between its evaporation temperature and its melting temperature and high light absorption is desirable, and is achieved utilizing the above parameters.

A PDP deposited under the abovementioned conditions has one or more of the following properties:
  (a) the material is stable enough to act as a passivation layer;
  (b) when ablated by laser, preferably a visible light laser, the material absorbs enough of the incident laser energy directed at it so that underlying layers are not damaged by laser energy;
  (c) only areas directly illuminated by laser energy are ablated;
  (d) the material is ablative, i.e., it vaporizes rather than explodes, so that very little debris is formed on the substrate when the material is ablated;
  (e) the material is ablated in response to relatively low levels of energy;
  (f) the material has good filling qualities, so that it can be deposited evenly over non leveled geometries;
  (g) the material is insulative;
  (h) the material adheres well to the substrate;
  (i) the material is resistant to at least some forms of metal etching;
  (j) the material is ablateable by e-beam; and
  (k) the material is etchable by some means, which preferably do not etch the structure of the underlying integrated circuit.

Alternately, a PDP having a selected absorption coefficient can be deposited by properly selecting the power density used to generate said plasma.

There is thus provided according to a preferred embodiment of the invention a method of customizing integrated circuits:
  providing an integrated circuit;
  depositing a PDP on the integrated circuit; and
  ablating the PDP at preselected locations using a laser beam, preferably a visible light laser beam.

Preferably, the integrated circuit is then etched, preferably by reactive ion etching, at locations underlying said ablated locations.

There is further provided in accordance with a preferred embodiment, of the invention a PDP ablateable by visible light.

Also provided in accordance with a preferred embodiment of the invention is an integrated circuit coated with a PDP ablateable by visible light.

There is further provided in accordance with a preferred embodiment of the invention a PDP deposited according the above described deposition parameters.

DESCRIPTION OF THE PREFERRED EMBODIMENTS

Figure 1:
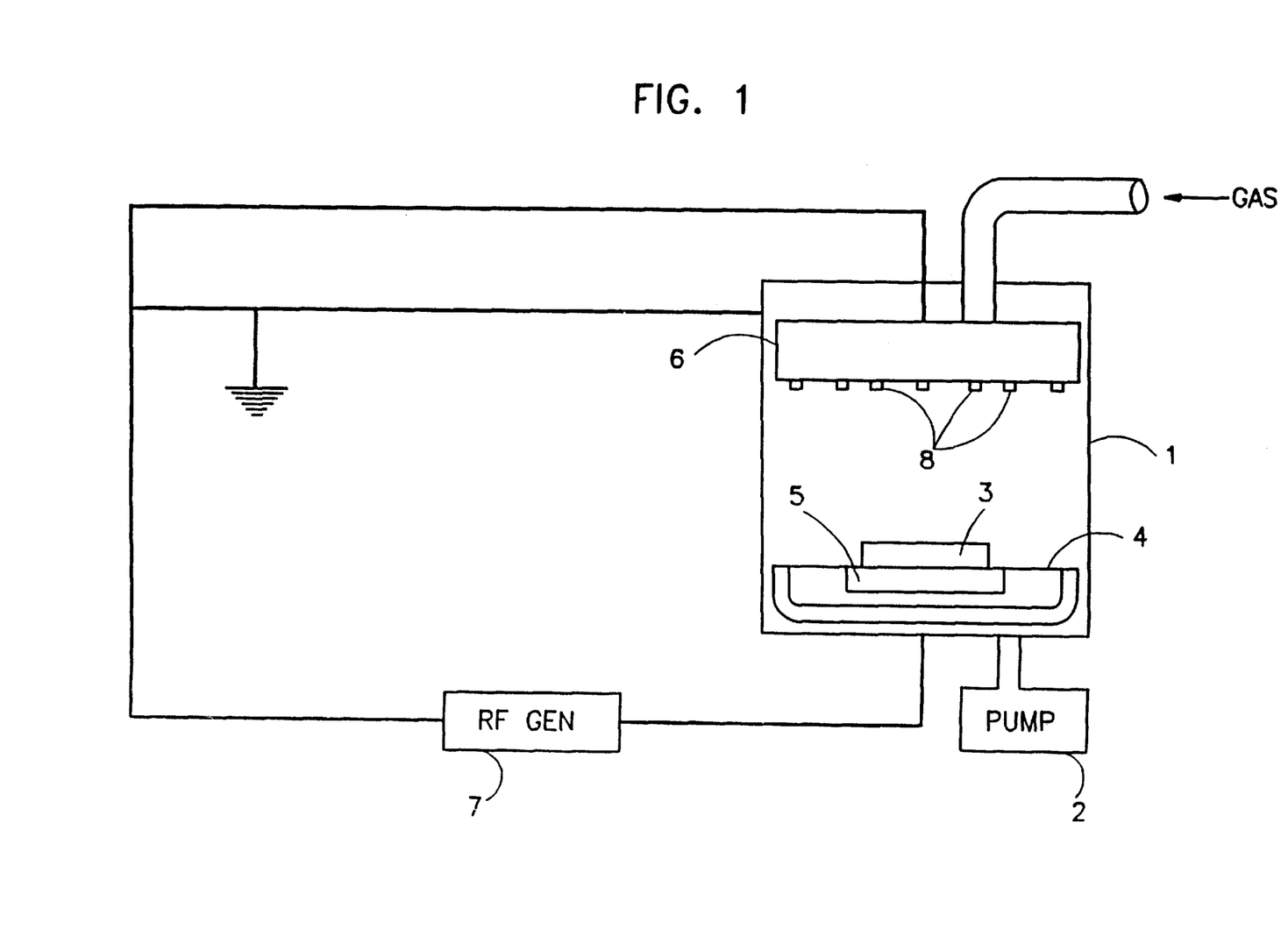
FIG. 1 is a schematic of a vapor deposition chamber as used in forming an ablative layer in accordance with a preferred embodiment of the invention.

FIG. 1 shows a plasma vacuum chamber 1 suitable for depositing a Plasma Deposited Polymer (PDP) on a substrate, for example, a Plasma-Therm model 790 vacuum chamber.

A substrate 3, to be coated with a PDP is placed in chamber 1, preferably on a cathode 4. The temperature of substrate 3 may be controlled by a heater/cooler 5 such that during deposition the substrate is maintained at a substantially constant temperature. Preferably, the substrate is maintaining at 20° C. while the walls of the chamber are heated. A pump 2 reduces the gas pressure in chamber 1. Preferably, the pressure in the chamber during the deposition is approximately 1 torr, however, pressures between 0.1 and 2 torr are useful in carrying out the invention.

A gas is supplied to chamber 1, preferably through a plurality of nozzles 8 formed in an anode 6. The gas is typically a mixture of an active gas, preferably an organic compound such as ethylene or another hydro-carbon and an inactive gas such as argon. Preferably, the ratio between the active gas and the inactive gas is between 7:3 and 3:7, preferably, at a ratio of about 1:1. The rate at which the gas mixture is supplied is called the "flow rate" and is preferably between 1 sccm and 50 sccm, preferably 20 sccm.

Since many organic compounds and in particular: $C_2H_2$, $C_6H_6$, $C_6F_6$, $C_2H_4$, $C_2F_4$, Styrene, Cyclohexane, Ethylene oxide, Acrylic acid, Propionic acid, Vinyl acetate, Methyl acrylate, Hexamethyldisilane, Tetramethyldisiloxane, Hexamethyldisiloxane, Divinyltetramethyldisiloxane and many hydrocarbon compounds are known to be interchangeable with ethylene in PDP deposition, a PDP ablateable by visible laser light can be obtained if any of the preceding organic materials are used, with appropriate changes in the deposition parameters, if required.

An RF generator 7, preferably operating at 13.6 MHz, is connected between anode 6 and cathode 4. For a cathode diameter of 8" the power output of RF generator 6 is typically between 25W and 500W, preferably, between 75W and 150W. Preferably, anode 6 and (the walls of) chamber 1 are grounded and a voltage differential appears between them and cathode 4. The distance between anode 6 and cathode 4 is between 1.5 and 10 cm, preferably, 3 cm.

Alternatively, the active gas is turned into a plasma in a separate compartment within the chamber. The inactive gas may be added to the active gas before or after it is turned into a plasma.

In a chamber configured as described above, a layer of PDP is continuously deposited on substrate 3. Preferably, a layer having a thickness of about $0.6\mu$ is deposited within less than 15 minutes.

It is to be appreciated that some other combinations of values for the above parameters may also result in a PDP being deposited and in some cases, the resultant PDP may be ablateable by visible laser light.

A PDP deposited according to the abovementioned configuration will be ablateable by visible laser light and will have some or all of the following properties:

(a) low thermal conductivity;

(b) low evaporation temperature;

(c) an absorption coefficient of at least $3*10^3$ cm$^{-1}$ in the mid-visible range;.

(d) stability in Chlorine and Fluorine plasmas, generally used to etch metal layers and insulation layers respectively;

(e) ablateability at ambient conditions by visible laser radiation (at 532 nm or 527 nm) at pulse energy densities below 4 J/cm$^2$;

(f) etchability in an oxygen plasma;

(g) capability of filling cracks which are approximately as wide as the layer of PDP;

(h) even deposition on the substrate;

(i) insulating capability;

(j) ablation without forming many particles at laser energy above 1 J*cm$^{-2}$.

(k) good conformance between the ablation pattern and the laser radiation pattern;

(l) good adhesion to the substrate; and (m) stability over a period of more than a year in storage, so that the PDP can be used as a passivation layer.

The inventors have also discovered that a PDP deposited according to a preferred embodiment of the invention has an evenly monotonically decreasing absorption coefficient in the visible light range. Thus, it is easily ablateable by ultraviolet light lasers and also ablateable by laser light in the near infra red.

Figure 2A:
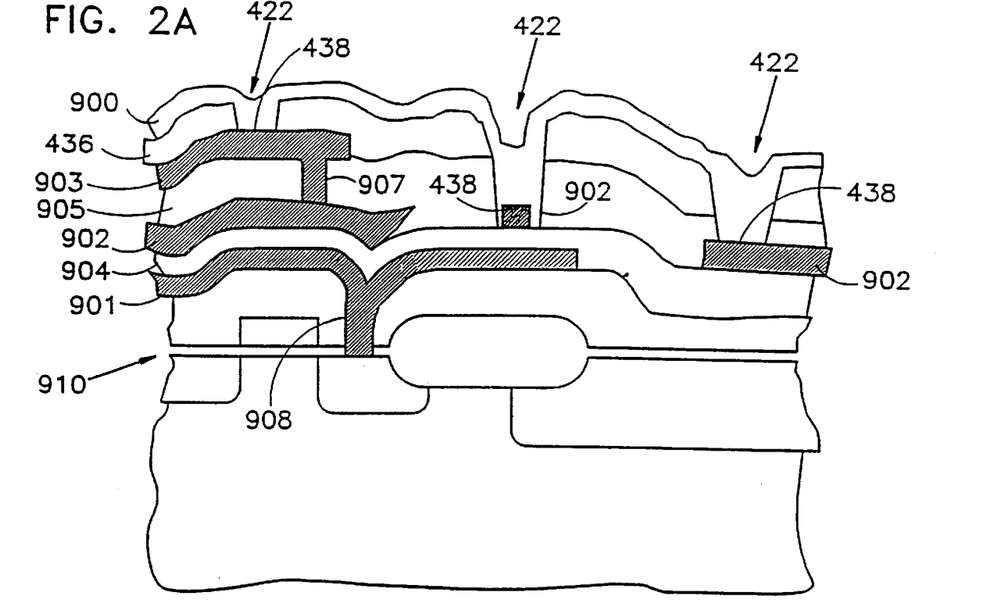
FIGS. 2A–2C show an integrated circuit customized in accordance with a preferred embodiment of the invention.
Figure 2B:
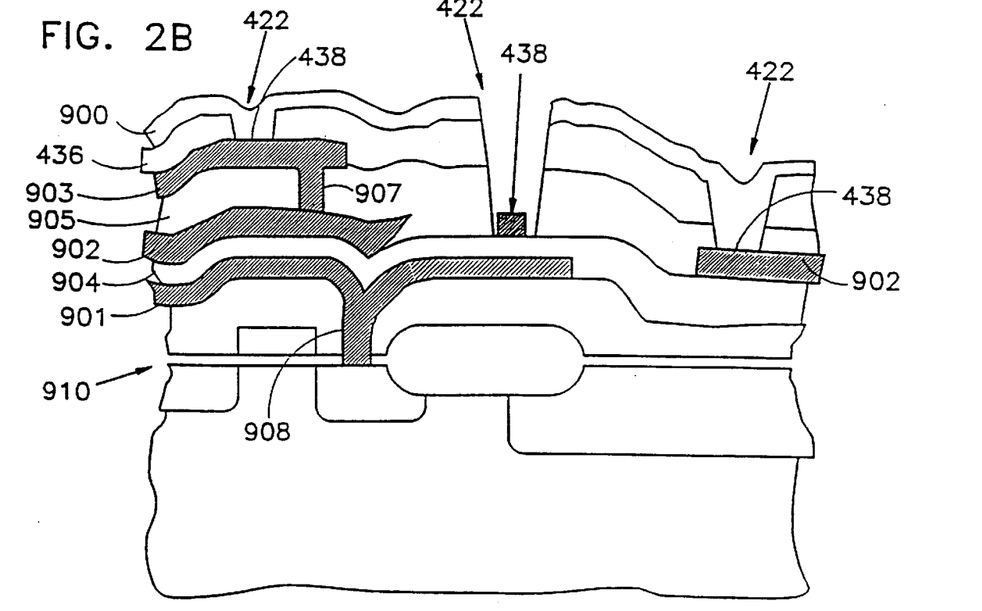
Figure 2C:
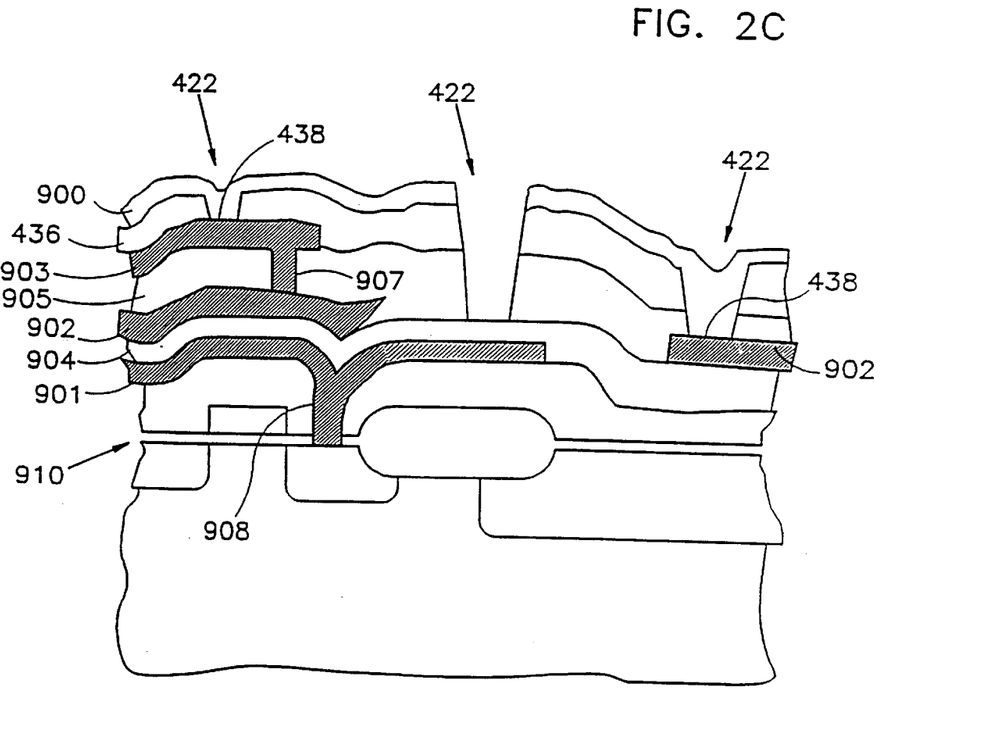

A preferred use of a PDP having the abovementioned properties is in customization of integrated circuits. FIGS. 2A–2C show customization of an integrated circuit in accordance with the present invention. FIG. 2A shows an integrated circuit which includes a metal layer 901, separated from a second metal layer 902 by an insulation layer 904. Layer 902 is also covered by a second insulation layer 905, and another metal layer 903 covers layer 905. The entire top of the integrated circuit is preferably covered with a passivation layer 436. Since customization preferably includes disconnecting metal links in layers 902 and/or 903, a plurality of apertures 422 are preferably formed through passivation layer 436 and through any intervening layers down to a metal link 438 that is to be disconnected. U.S. Pat. No. 4,924,287 to Orbach and U.S. patent application Ser. No. 08/290,550, filed Aug. 15, 1994 and titled "A Customizable Logic Array Device", the disclosures of which are incorporated herein by reference, both describe an integrated circuit preferred for customization.

A first step of the customization process, as shown in FIG. 2A, includes depositing a layer 900 of PDP over the integrated circuit. Preferably, the layer is $1\mu$ thick. Since PDP layer 900 is preferably stable at ambient room conditions, the coated integrated circuit is preferably manufactured in large runs and stored until needed.

A second step of the customization process, as shown in FIG. 2B, includes ablating PDP layer 900 at selected locations. Preferably these locations are over apertures 422. Preferably, a NdYAG frequency doubled laser at 532 nm or Nd YLF at 523 nm is used for ablating PDP layer 900. Alternatively an Argon laser at 514 nm or at 488 nm is used. Preferably, the pulses are approximately 100 nanoseconds long and have an energy density of approximately 4 J/cm$^2$. The ablations can be performed using a laser micromachining system, preferably, a QS650 available from Chip Express (Israel) LTD.

A third step of the customization process, as shown in FIG. 2C, includes etching the integrated circuit, preferably, using Chlorine plasma.

Preferably, the remaining PDP is removed by Oxygen plasma and a passivation layer is formed over the customized integrated circuit.

Figure 3A:
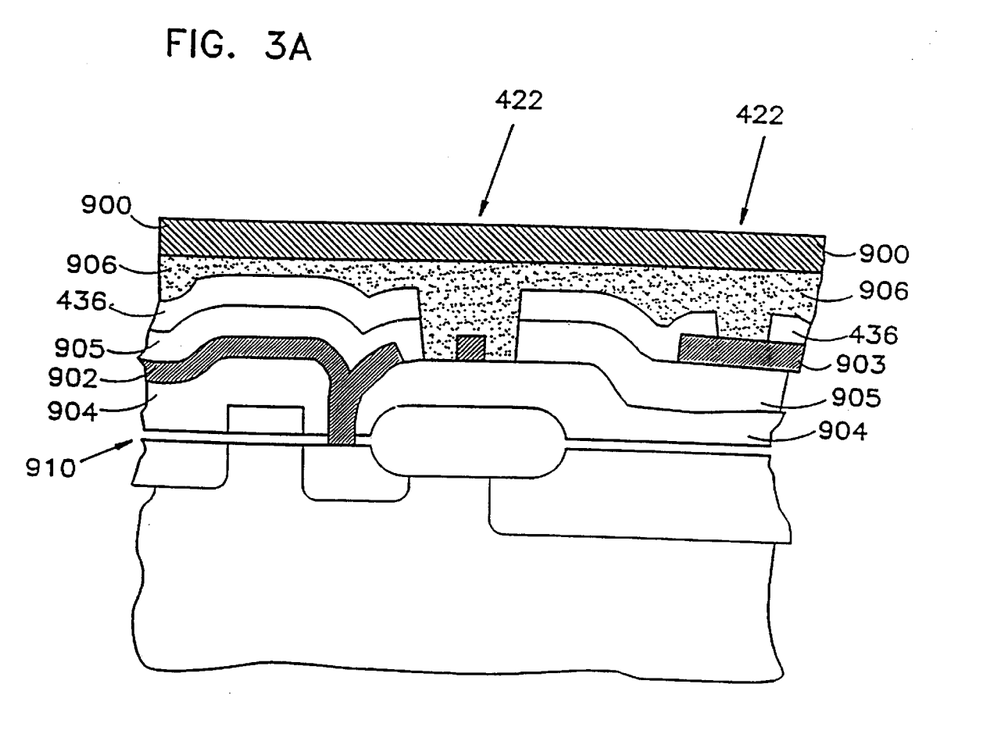
FIGS. 3A–3D show an integrated circuit customized in accordance with an alternative preferred embodiment of the invention.

FIGS. 3A–3D show an alternative preferred customization process similar to the abovedescribed process. In this embodiment, the integrated circuit is first coated with a planarization layer 906, preferably silicon dioxide or other insulating planerizing materials as well known in the art, before the step of depositing PDP layer 900 thereon (FIG. 3A).

Figure 3B:
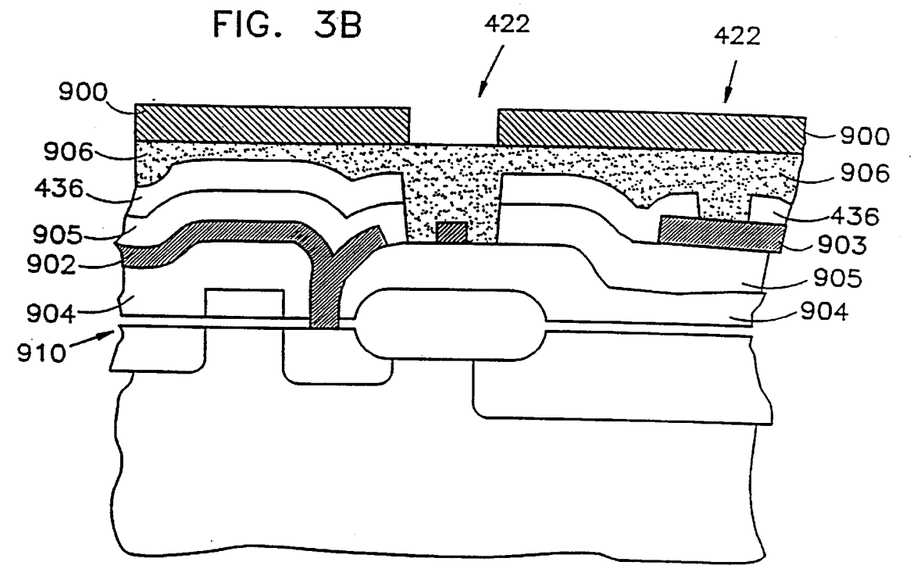
Figure 3C:
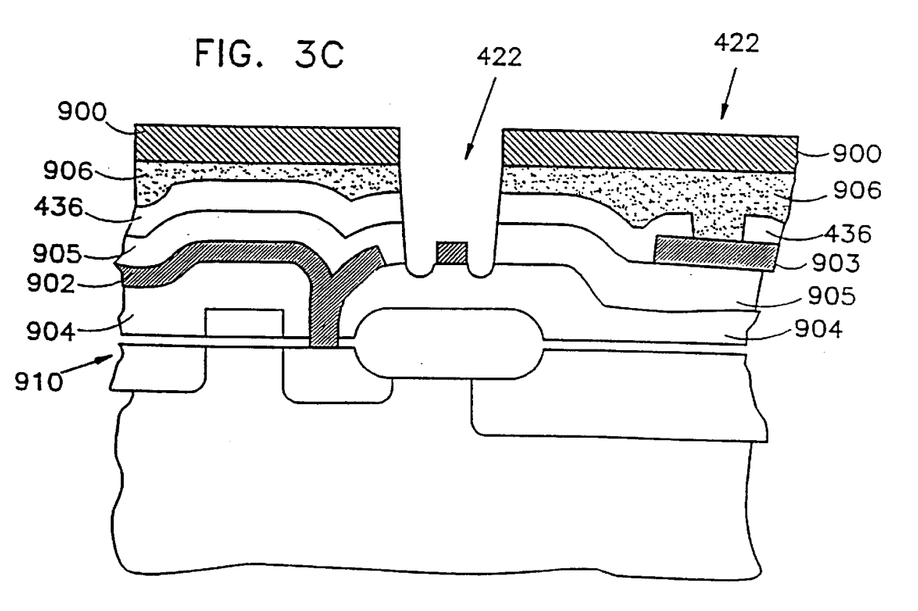

FIG. 3B shows the device after layer 900 is ablated at selected locations.

Figure 3D:
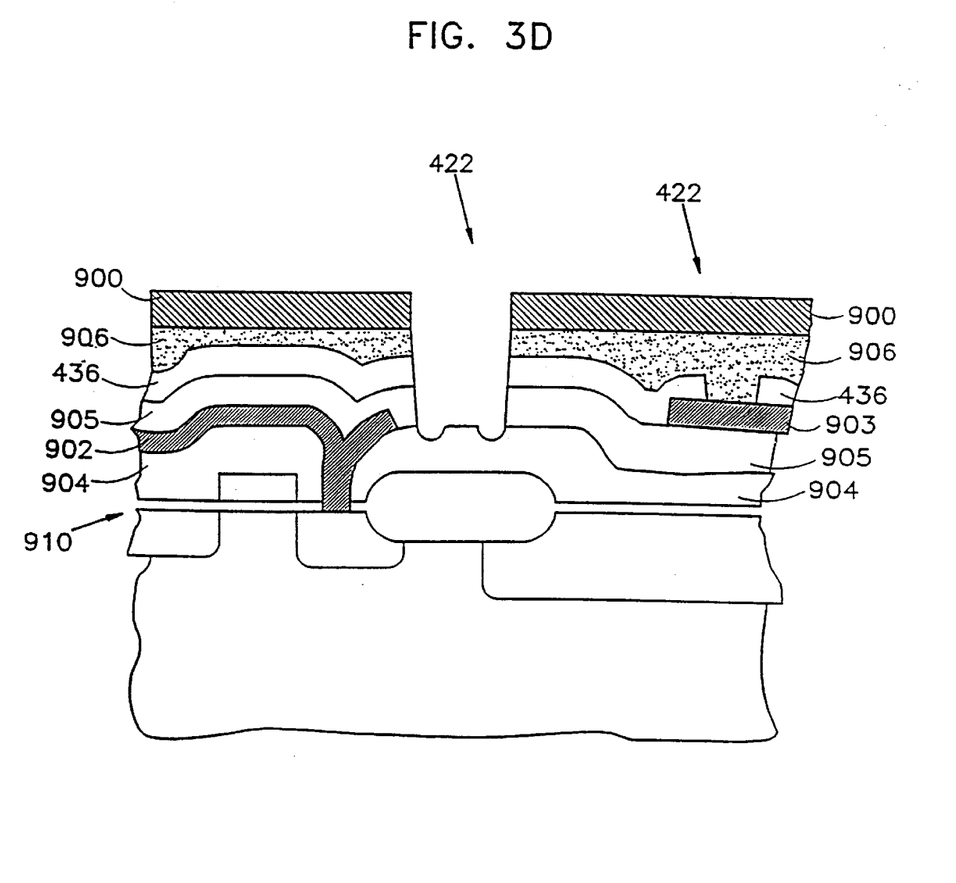

An additional step of etching planarization layer 906, preferably with $CF_4$ plasma is preformed (FIG. 3C) before etching the integrated circuit itself (FIG. 3D).

The abovedescribed customization processes can be carried out on most kinds of integrated circuits, including CMOS devices, gate arrays, multi-chip packages and memory chips.

Additionally, the inventors have found that the ablation pattern of the PDP is very similar to the irradiation pattern used, so that very precise micromachining of the PDP is possible. The depth of the cut is controlled with a precision of $0.3\mu$ or better. The radius of curvature at the corners of rectangular cuts is $0.2\mu$ or less, even though a wavelength of $0.532\mu$ was used. This is attributed to the threshold nature of the ablation process and to the properties of imaging with laser coherent light.

The inventors have found that the PDP is more versatile than using standard photo-resists because it does not need to be developed and washed away. Furthermore, the inventors has discovered that the optical properties of the PDP, in particular absorption, can be controlled by changing the RF power used to ionized the gas, therefore, a PDP layer with the correct absorption can be produced for any chosen laser wavelength and any desirable film thickness. Additionally, the etch resistance properties of the PDP are similar to those of standard photo-resists.

It will he appreciated by persons skilled in the art that the present invention is not limited to what has been thus far described. Rather, the scope of the present invention is limited only by the following claims:

What is claimed is:

1. A polymer film formed of polymerized hydro-carbon molecules which is suitable for plasma deposition on an integrated circuit substrate and which is ablatable by visible laser radiation.

2. A polymer film according to claim 1, which is ablatcable by a laser energy density tower than 4 $J/cm^2$.

3. A polymer film according to claim 2, which is partially resistant to at least one method of metal etching.

4. A polymer film formed of polymerized hydro-carbon molecules which is suitable for plasma deposition on an integrated circuit substrate and which is ablatable by visible laser radiation, wherein said plasma deposition is effected by:

providing a plasma chamber;

providing said integrated circuit substrate in said chamber; and providing a gas plasma in said chamber by activating a gas comprising an organic gas to form said gas plasma by a radio frequency electric field having a power density of between 0.08 and 1.59 $Watt*cm^{-2}$.

5. A polymer film ablateable by visible light according to claim 4 wherein said power density is between 0.24 and 0.48 $Watt*cm^{-2}$ and wherein said organic gas is a hydro-carbon compound.

6. A polymer film ablateable by visible light according to claim 5, wherein said organic gas comprises ethylene.

7. A polymer film ablateable by visible light according to claim 4, wherein said plasma has a flow rate between 1 and 50 sccm.

* * * * *